United States Patent
Choi

(10) Patent No.: US 10,054,814 B2
(45) Date of Patent: Aug. 21, 2018

(54) ARRAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventor: Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,603

(22) PCT Filed: Mar. 3, 2016

(86) PCT No.: PCT/CN2016/075421
§ 371 (c)(1),
(2) Date: Jan. 6, 2017

(87) PCT Pub. No.: WO2016/150286
PCT Pub. Date: Sep. 29, 2016

(65) Prior Publication Data
US 2017/0205662 A1 Jul. 20, 2017

(30) Foreign Application Priority Data
Mar. 23, 2015 (CN) .......................... 2015 1 0128657

(51) Int. Cl.
*H01L 27/14* (2006.01)
*G02F 1/1335* (2006.01)
(Continued)

(52) U.S. Cl.
CPC ...... *G02F 1/133504* (2013.01); *G02F 1/1368* (2013.01); *G02F 1/13439* (2013.01);
(Continued)

(58) Field of Classification Search
CPC ........... H01L 27/3248; H01L 29/42384; G02F 1/133514; G02F 1/133504; G02F 1/1368;
(Continued)

(56) References Cited

U.S. PATENT DOCUMENTS

2001/0013913 A1* 8/2001 Young ............... G02F 1/136227
349/113
2006/0033853 A1* 2/2006 Lee .................... G02F 1/133707
349/42

(Continued)

FOREIGN PATENT DOCUMENTS

CN 101526685 A 9/2009
CN 102023435 A 4/2011
(Continued)

OTHER PUBLICATIONS

First Office Action dated Mar. 15, 2017 in corresponding Chinese Application No. 201510128657.0.
(Continued)

*Primary Examiner* — A. Sefer
(74) *Attorney, Agent, or Firm* — Nath, Goldberg & Meyer; Joshua B. Goldberg

(57) ABSTRACT

The present invention discloses an array substrate and a manufacturing method thereof, and a display apparatus. The array substrate comprises a base substrate, and a thin film transistor, a color filter layer and a first passivation layer provided on the base substrate. The surface of the first electrode provided by the present invention is provided with a concave-convex structure that can scatter external incident light, so that incident light from outside is diffusely reflected, thereby avoiding excessive concentration of light and improving external visibility and recognizability of the displayed pictures.

12 Claims, 4 Drawing Sheets

(51) Int. Cl.
  *G02F 1/1368* (2006.01)
  *G02F 1/1343* (2006.01)
  *G02F 1/1333* (2006.01)
  *H01L 27/32* (2006.01)
  *G02F 1/1362* (2006.01)

(52) U.S. Cl.
  CPC .. *G02F 1/133345* (2013.01); *G02F 1/134309* (2013.01); *H01L 27/3244* (2013.01); *G02F 2001/133357* (2013.01); *G02F 2001/134318* (2013.01); *G02F 2001/136222* (2013.01); *G02F 2201/121* (2013.01)

(58) Field of Classification Search
  CPC ........... G02F 1/13439; G02F 1/134309; G02F 1/133345; G02F 2001/133357; G02F 2201/121; G02F 2001/136222
  See application file for complete search history.

(56) References Cited

U.S. PATENT DOCUMENTS

| | | | |
|---|---|---|---|
| 2006/0261335 A1* | 11/2006 | Nakahori | G02F 1/133555 257/59 |
| 2008/0239227 A1* | 10/2008 | Fan Jiang | G02F 1/133512 349/144 |
| 2009/0152555 A1 | 6/2009 | Park et al. | |
| 2009/0225017 A1* | 9/2009 | Kim | G02F 1/133514 345/88 |
| 2009/0303424 A1* | 12/2009 | Lee | G02F 1/136227 349/122 |
| 2010/0001276 A1* | 1/2010 | Kim | G02F 1/136227 257/59 |
| 2010/0007825 A1* | 1/2010 | Kwon | G02F 1/134309 349/114 |
| 2010/0157235 A1* | 6/2010 | Shim | G02F 1/133516 349/155 |
| 2011/0069246 A1 | 3/2011 | Wang | |
| 2014/0054581 A1 | 2/2014 | Song et al. | |
| 2014/0354924 A1* | 12/2014 | Byun | G02F 1/133514 349/106 |
| 2015/0097191 A1* | 4/2015 | Chen | H01L 51/5209 257/72 |
| 2016/0306241 A1 | 10/2016 | Choi | |

FOREIGN PATENT DOCUMENTS

| | | |
|---|---|---|
| CN | 102681276 A | 9/2012 |
| CN | 203150551 U | 8/2013 |
| CN | 104536194 A | 4/2015 |
| CN | 204302626 U | 4/2015 |
| CN | 104733456 A | 6/2015 |

OTHER PUBLICATIONS

International search report dated May 30, 2016 for corresponding PCT application PCT/CN2016/075421.
English translation of the written opinion of the international searching authority.

* cited by examiner

Forming a thin film transistor, a color filter layer and a first passivation layer on a base substrate ⸺ 1

Forming a first electrode on the first passivation layer, the first electrode being a non-transparent metal electrode and surface of the first electrode being provided with a concave-convex structure to scatter external incident light ⸺ 2

ARRAY SUBSTRATE, MANUFACTURING METHOD THEREOF, AND DISPLAY APPARATUS

CROSS-REFERENCES TO RELATED APPLICATIONS

This is a National Phase Application filed under 35 U.S.C. 371 as a national stage of PCT/CN2016/075421, filed on Mar. 3, 2016, an application claiming the benefit of Chinese Application No. 201510128657.0, filed on Mar. 23, 2015, the content of each of which is hereby incorporated by reference in its entirety.

TECHNICAL FIELD

The present invention relates to the field of display technology, and particularly relates to an array substrate and a manufacturing method thereof, and a display apparatus.

BACKGROUND

Display devices such as liquid crystal display (LCD for short) devices, organic electroluminescent devices (OELD for short), and the like have become necessities in people's life. With the increasing requirements of people, Color Filter on Array (COA for short) technique is proposed to improve display quality of a display device and avoid problem of adversely affected aperture ratio or light leak of a display device due to deviation generated in assembling an array substrate and a color filter substrate.

In an existing array substrate using COA, a first electrode provided at the upmost of the array substrate will reflect external incident light, which results in degraded external visibility, and thus, light utilization ratio is decreased and recognizability of displayed pictures is lowered.

SUMMARY

Embodiments of the present invention provide an array substrate and a manufacturing method thereof, and a display apparatus, so as to solve the problem in the prior art that a first electrode reflects external incident light, resulting in degraded external visibility, decreased light utilization ratio and lowered recognizability of displayed pictures.

Embodiments of the present invention provide an array substrate, including a base substrate, and a thin film transistor, a color filter layer and a first passivation layer provided on the base substrate, wherein a first electrode, which is a non-transparent metal electrode, is provided on the first passivation layer, and surface of the first electrode is provided with a concave-convex structure for scattering external incident light.

Optionally, the color filter layer is provided on the thin film transistor, a planarization layer is provided on the color filter layer, a second electrode, which is a transparent electrode, is provided on the planarization layer, and the first passivation layer is provided on the second electrode.

Optionally, the first electrode further includes a plurality of strip-shaped sub-electrodes distributed parallel to each other, and the strip-shaped sub-electrodes are provided correspondingly to the second electrode.

Optionally, the first electrode further includes a planer sub-electrode, the planer sub-electrode and the strip-shaped sub-electrodes are provided in a same layer, and the planar sub-electrode is provided correspondingly to an area of the thin film transistor and an area between pixel units.

Optionally, the array substrate further includes a first via hole, a second via hole and a common electrode line, the common electrode line is provided in the same layer as a gate of the thin film transistor, the first electrode is connected to the common electrode line through the first via hole, and the second electrode is connected to a drain of the thin film transistor through the second via hole.

Optionally, material for forming the first electrode includes molybdenum, aluminum, neodymium aluminum, or copper.

Embodiments of the present invention further provide a display apparatus including any one of the above array substrates.

Embodiments of the present invention further provide a manufacturing method of an array substrate, including steps of:

forming a thin film transistor, a color filter layer and a first passivation layer on a base substrate; and forming a first electrode on the first passivation layer, the first electrode being a non-transparent metal electrode and surface of the first electrode being provided with a concave-convex structure to scatter external incident light.

Optionally, the first electrode includes a plurality of strip-shaped sub-electrodes distributed parallel to each other and a planar sub-electrode, and the step of forming a first electrode on the first passivation layer includes: forming the planar sub-electrode and the strip-shaped sub-electrodes in a same layer such that the planar sub-electrode is provided correspondingly to an area of the thin film transistor and an area between pixel units and the strip-shaped sub-electrodes are provided correspondingly to a display area of the pixel unit.

Optionally, the step of forming a first electrode on the first passivation layer includes:

forming a metal film on the first passivation layer;

forming a photoresist on the metal film;

exposing, using a halftone mask or a gray-tone mask, and developing the photoresist to form a photoresist-completely-remaining area, a photoresist-partially-remaining area and a photoresist-completely-removed area, the photoresist-completely-remaining area and the photoresist-partially-remaining area corresponding to a pattern of the first electrode to be formed;

performing a first etching on the metal film to form the first electrode;

performing ashing treatment on the photoresist to remove the photoresist in the photoresist-partially-remaining area;

performing a second etching on the first electrode to form the concave-convex structure; and removing the remaining photoresist.

Optionally, the first etching is wet etching, and the second etching is dry etching.

Optionally, the step of forming a thin film transistor, a color filter layer and a first passivation layer on a base substrate includes steps of:

forming the thin film transistor on the base substrate;

forming the color filter layer on the thin film transistor; and forming the first passivation layer above the color filter layer, wherein the manufacturing method includes, before the step of forming the first passivation layer above the color filter layer, steps of:

forming a planarization layer on the color filter layer; and forming a second electrode on the planarization layer, wherein the first passivation layer is provided on the second electrode, and the second electrode, which is a transparent electrode, is provided correspondingly to the display area of the pixel unit.

The present invention has the beneficial effects as follow.

The array substrate provided by the present invention includes a base substrate and a thin film transistor, a color filter layer and a first passivation layer on the base substrate, and a first electrode is provided on the first passivation layer. Surface of the first electrode provided by the present invention is provided with a concave-convex structure, which can scatter external incident light, so that light emitted from outside is diffusely reflected, thereby avoiding excessive concentration of light and improving external visibility and recognizability of the displayed pictures. The display apparatus provided by the present invention includes the array substrate provided by the present invention, and thus has improved display effect.

DETAILED DESCRIPTION

To enable those skilled in the art to better understand the technical solutions of the present invention, an array substrate and a manufacturing method thereof, and a display apparatus provided by the present invention will be described in detail below in conjunction with the accompanying drawings.

First Embodiment

Figures 1, 2:
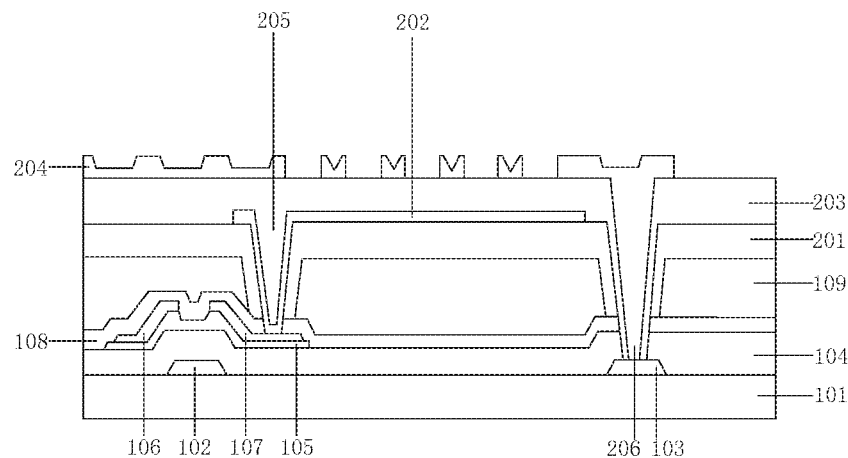
FIG. 1 is a cross-sectional view of an array substrate provided by a first embodiment of the present invention.
FIG. 2 is a flowchart of a manufacturing method of an array substrate provided by a third embodiment of the present invention.

FIG. 1 is a cross-sectional view of an array substrate provided by the first embodiment of the present invention. As shown in FIG. 1, the array substrate includes a base substrate 101, a gate 102, a common electrode line 103, a gate insulating layer 104, an active layer 105, a source 106, a drain 107, a second passivation layer 108, a color filter layer 109, a planarization layer 201, a second electrode 202, a first passivation layer 203 and a first electrode 204. The gate 102 and the common electrode line 103 are provided on the base substrate 101 in a same layer, the gate insulating layer 104 is provided on the gate 102 and the common electrode line 103, the active layer 105 is provided on the gate insulating layer 104, the source 106 and the drain 107 are provided on the active layer 105, the second passivation layer 108 is provided on the source 106 and the drain 107, the color filter layer 109 is provided on the second passivation layer 108, the planarization layer 201 is provided on the color filter layer 109, the second electrode 202 is provided on the planarization layer 201 and is connected to the drain 107 through a second via hole 205 penetrating through the second passivation layer 108, the first passivation layer 203 is provided on the second electrode 202, and the first electrode 204 is provided on the first passivation layer 203 and is connected to the common electrode line 103 through a first via hole 206 penetrating through both the gate insulating layer 104 and the second passivation layer 108.

In this embodiment, the first electrode 204 is a non-transparent metal electrode, and surface of the first electrode is provided with a concave-convex structure for scattering external incident light, so that incident light from outside is diffusely reflected, thereby avoiding excessive concentration of light and improving external visibility and recognizability of the displayed pictures. In addition, the first electrode 204 includes a plurality of strip-shaped sub-electrodes parallel to each other and a planar sub-electrode, the planar sub-electrode and the strip-shaped sub-electrodes are provided in a same layer. The planar sub-electrode is arranged to correspond to an area of the thin film transistor and an area between pixel units, that is to say, the planar sub-electrode is provided at a position where a black matrix in the prior art is provided and achieves the function of the black matrix, and thus the black matrix can be omitted. The strip-shaped sub-electrodes are arranged to correspond to the second electrode 202, that is, the strip-shaped sub-electrodes are provide at a position where a common electrode in the prior art is provided and achieve the function of the common electrode. It should be noted that in a case where the array substrate is provided with a black matrix, the first electrode 204 may include only the plurality of strip-shaped sub-electrodes parallel to each other, but not include the planar sub-electrode.

In this embodiment, the base substrate 101 may be a glass substrate or a quartz substrate. The gate 102, the source 106 and the drain 107 may be made of metal material. The gate insulating layer 104 may be made of silicon nitride, or may be made of silicon oxide and silicon oxynitride. The active layer 105 may be made of a metal oxide semiconductor material. The second passivation layer 108 and the first passivation layer 203 may be made of silicon nitride or an organic resin material. The planarization layer 201 may be made of a resin material. The second electrode 202 may be made of indium tin oxide (ITO for short) or indium-doped zinc oxide (IZO for short). The first electrode 204 may be made of a metal material such as molybdenum, aluminum, neodymium aluminum, or copper.

The array substrate provided by the embodiment includes a base substrate and a thin film transistor, a color filter layer and a first passivation layer on the base substrate. A first electrode, which is a non-transparent metal electrode, is provided on the first passivation layer, and surface of the first electrode is provided with a concave-convex structure to disperse external incident light. The surface of the first electrode in the array substrate provided by the embodiment is provided with the concave-convex structure, which can scatter external incident light, so that incident light from outside is diffusely reflected, thereby avoiding excessive concentration of light and improving external visibility and recognizability of the displayed pictures.

Second Embodiment

This embodiment provides a display apparatus comprising the array substrate provided by the first embodiment, and the detailed description thereof can refer to those about the array substrate of the first embodiment and is not repeated herein.

In the display apparatus provided by the embodiment, the array substrate includes a base substrate and a thin film transistor, a color filter layer and a first passivation layer on the base substrate. A first electrode, which is a non-transparent metal electrode, is provided on the first passivation layer, and surface of the first electrode is provided with a concave-convex structure to scatter external incident light.

The surface of the first electrode in the array substrate of the display apparatus provided by the embodiment is provided with the concave-convex structure, which can scatter external incident light, so that incident light from outside is diffusely reflected, thereby avoiding excessive concentration of light and improving external visibility and recognizability of the displayed pictures.

Third Embodiment

FIG. 2 is a flowchart of a manufacturing method of an array substrate provided by the third embodiment of the present invention. FIGS. 3 to 7 are cross-sectional views of intermediate structures in manufacturing the array substrate shown in FIG. 1. As shown in FIG. 2, the manufacturing method includes the following steps 1 and 2.

In step 1, a thin film transistor, a color filter layer and a first passivation layer are formed on a base substrate.

Figure 3:
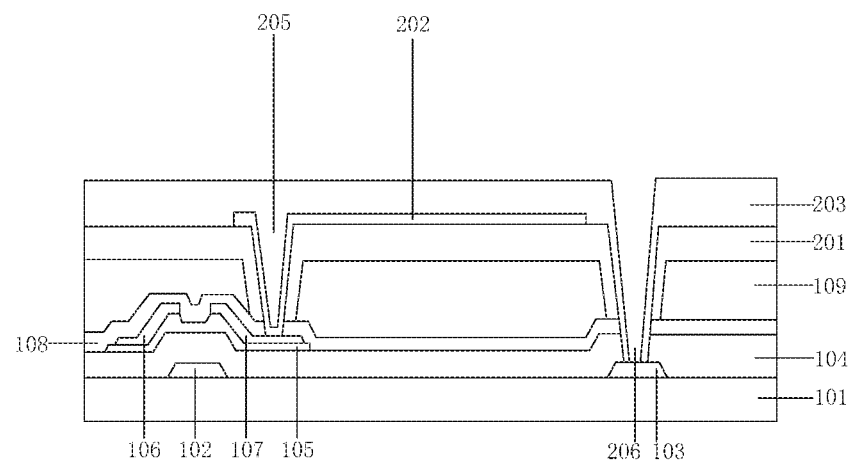
FIGS. 3 to 7 are cross-sectional views of intermediate structures in manufacturing the array substrate shown in FIG. 1.

As shown in FIG. 3, a gate 102, a common electrode line 103, a gate insulating layer 104, an active layer 105, a source 106, a drain 107, a second passivation layer 108, a color filter layer 109, a planarization layer 201, a second electrode 202, and a first passivation layer 203 are sequentially formed on a base substrate 101. A via hole is formed in parts of the second passivation layer 108, the color filter layer 109 and the planarization layer 201 corresponding to the drain 107, respectively, thus forming a second via hole 205 penetrating through the second passivation layer 108, the color filter layer 109 and the planarization layer 201, and the second electrode 202 is connected to the drain 107 through the second via hole 205. A via hole is formed in parts of the gate insulating layer 104, the second passivation layer 108, the color filter layer 109, the planarization layer 201 and the first passivation layer 203 corresponding to the common electrode line 103, respectively, thus forming a first via hole 206 penetrating through the gate insulating layer 104, the second passivation layer 108, the color filter layer 109, the planarization layer 201 and the first passivation layer 203, and a first electrode 204 formed subsequently will be connected to the common electrode line 103 through the first via hole 206. Forming a via hole in an individual layer is prior art, and thus is not repeated herein.

In this embodiment, the base substrate 101 may be a glass substrate or a quartz substrate. The gate 102, the source 106 and the drain 107 may be made of metal material. The gate insulating layer 104 may be made of silicon nitride, or may be made of silicon oxide and silicon oxynitride. The active layer 105 may be made of a metal oxide semiconductor material. The second passivation layer 108 and the first passivation layer 203 may be made of silicon nitride or an organic resin material. The planarization layer 201 may be made of a resin material. The second electrode 202 may be made of indium tin oxide (ITO for short) or indium-doped zinc oxide (IZO for short).

In step 2, the first electrode is formed on the first passivation layer, the first electrode is a non-transparent metal electrode and surface of the first electrode is provided with a concave-convex structure to scatter external incident light.

In an example, the first electrode includes a plurality of strip-shaped sub-electrodes parallel to each other and a planar sub-electrode, and the step of forming the first electrode includes: forming the planar sub-electrode and the strip-shaped sub-electrodes in a same layer such that the planar sub-electrode is provided to correspond to an area of the thin film transistor and an area between pixel units and the strip-shaped sub-electrodes are provided to correspond to the second electrode.

Figure 4:
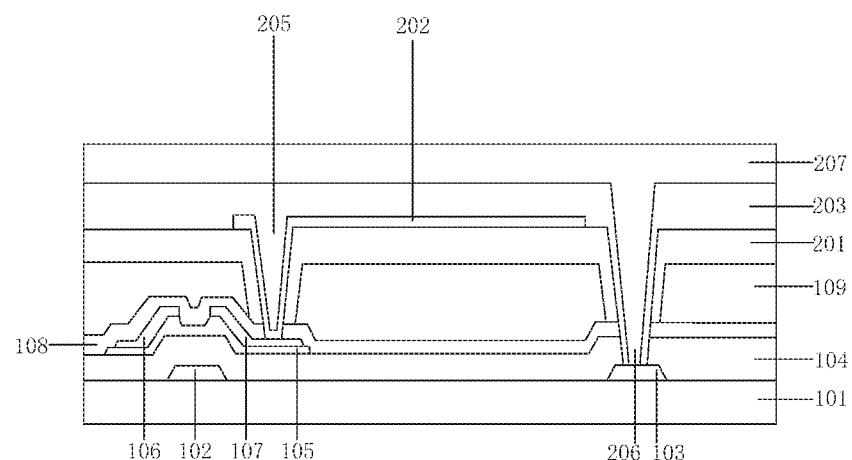
Figure 5:
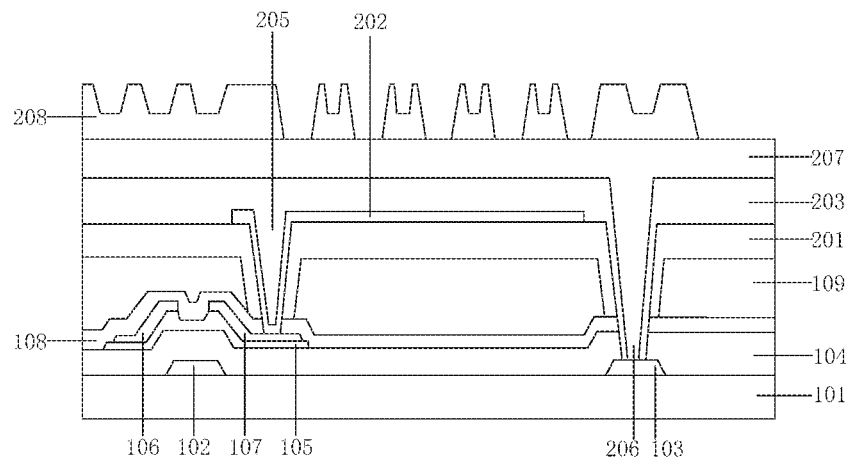

In an example, as shown in FIG. 4, a metal film 207 is formed on the first passivation layer 203. The metal film 207 has a thickness in the range of 100 nm to 300 nm. As shown in FIG. 5, a photoresist 208 is formed on the metal film 207, the photoresist 208 is exposed using a halftone mask or a gray-tone mask and developed to form a photoresist-completely-remaining area, a photoresist-partially-remaining area and a photoresist-completely-removed area, the photoresist-completely-remaining area and the photoresist-partially-remaining area corresponding to pattern of the first electrode to be formed.

Figure 6:
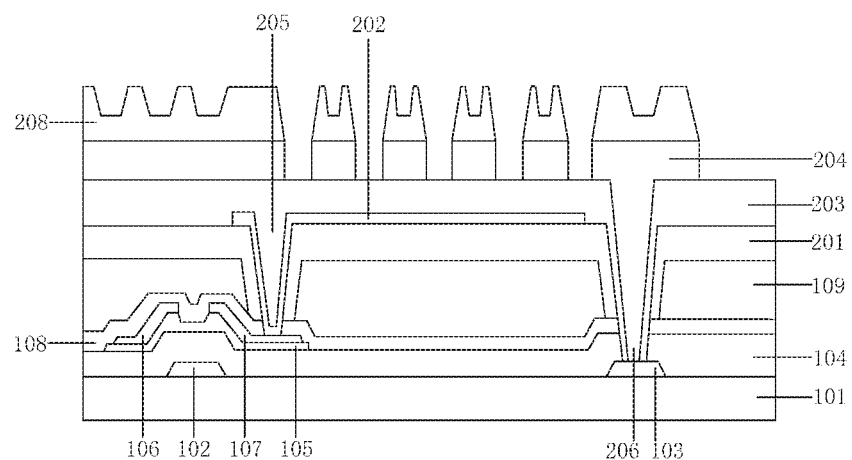
Figure 7:
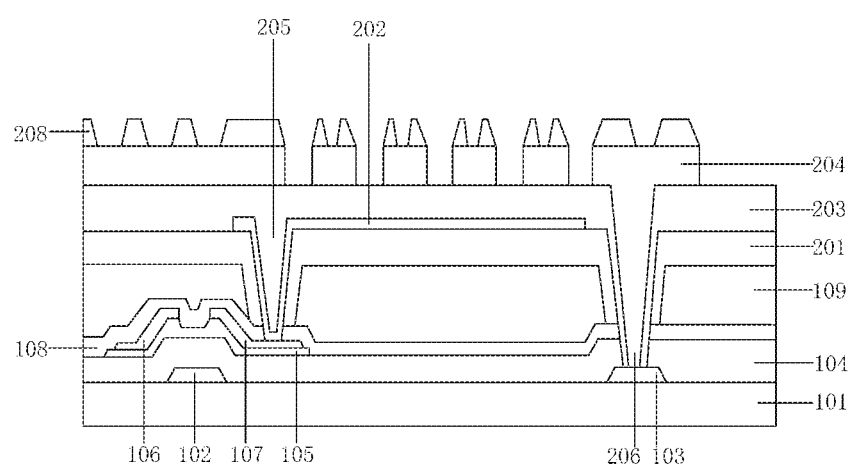

As shown in FIG. 6, a wet etching is performed on the metal film 207 to form the first electrode 204. As shown in FIG. 7, an ashing treatment is performed on the photoresist 208 to remove the photoresist in the photoresist-partially-remaining area. A dry etching is performed on the first electrode 204 to form the concave-convex structure, as shown in FIG. 1. Depth of the dry etching is in the range of 30% to 70% of thickness of the metal film 207, and thickness of the other area is no less than 50 nm. At last, the remaining photoresist 208 is removed. The first electrode 204 is a non-transparent metal electrode and the surface of the first electrode 204 is provided with a concave-convex structure 204 for scattering external incident light, so that incident light from outside is diffusely reflected, thereby avoiding excessive concentration of light and improving external visibility and recognizability of the displayed pictures. Optionally, the first electrode 204 may be made of a metal material such as molybdenum, aluminum, neodymium aluminum, or copper.

In this embodiment, the first electrode 204 includes a plurality of strip-shaped sub-electrodes parallel to each other and a planar sub-electrode, the planar sub-electrode and the strip-shaped sub-electrodes are provided in a same layer, and the planar sub-electrode is arranged to correspond to an area of the thin film transistor and an area between pixel units. That is to say, the planar sub-electrode is provided at a position where a black matrix in the prior art is provided and achieves the function of the black matrix, and thus the black matrix can be omitted. The strip-shaped sub-electrodes are arranged to correspond to the second electrode, that is, the strip-shaped sub-electrodes are provide at a position where a common electrode in the prior art is provided and achieve the function of the common electrode.

It should be noted that in a case where the array substrate is provided with a black matrix, the first electrode 204 may include only the plurality of strip-shaped sub-electrodes parallel to each other, but not include the planar sub-electrode. In this case, the first electrode 204 can still be formed by using the above method, and only the used halftone mask or gray-tone mask has a different pattern, which is not elaborated herein.

The array substrate manufactured by using the manufacturing method provided by this embodiment includes a base substrate and a thin film transistor, a color filter layer and a first passivation layer on the base substrate, a first electrode, which is a non-transparent metal electrode, is provided on the first passivation layer, and surface of the first electrode is provided with a concave-convex structure to scatter external incident light. The surface of the first electrode in the array substrate manufactured by using the manufacturing method provided by the embodiment is provided with the concave-convex structure, which can scatter external incident light, so that incident light from outside is diffusely reflected, thereby avoiding excessive concentration of light and improving external visibility and recognizability of the displayed pictures.

It should be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

What is claimed is:

1. An array substrate, comprising a base substrate, and a thin film transistor, a common electrode line, a color filter layer and a first passivation layer provided on the base substrate, wherein:
   a first electrode, which is a non-transparent metal electrode, is provided on the first passivation layer, surface of the first electrode is provided with a concave-convex structure for scattering external incident light, and the first electrode is connected to the common electrode line;
   the color filter layer is provided on the thin film transistor, a planarization layer is provided on the color filter layer, a second electrode, which is a transparent electrode, is provided on the planarization layer, and the first passivation layer is provided on the second electrode; and
   the first electrode further comprises a plurality of strip-shaped sub-electrodes substantially parallel to each other, and the strip-shaped sub-electrodes are provided correspondingly to the second electrode.

2. The array substrate of claim 1, wherein the first electrode further comprises a planer sub-electrode, the planer sub-electrode and the strip-shaped sub-electrodes are provided in a same layer, and the planar sub-electrode is provided correspondingly to an area of the thin film transistor and an area between pixel units.

3. The array substrate of claim 1, wherein the array substrate further comprises a first via hole and a second via hole, the common electrode line is provided in the same layer as a gate of the thin film transistor, the first electrode is connected to the common electrode line through the first via hole, and the second electrode is connected to a drain of the thin film transistor through the second via hole.

4. The array substrate of claim 1, wherein the first electrode is made of molybdenum, aluminum, neodymium aluminum, or copper.

5. A display apparatus comprising an array substrate, which comprises a base substrate, and a thin film transistor, a color filter layer and a first passivation layer provided on the base substrate, wherein:
   a first electrode, which is a non-transparent metal electrode, is provided on the first passivation layer, and surface of the first electrode is provided with a concave-convex structure for scattering external incident light;
   the color filter layer is provided on the thin film transistor, a planarization layer is provided on the color filter layer, a second electrode, which is a transparent electrode, is provided on the planarization layer, and the first passivation layer is provided on the second electrode; and
   the first electrode further comprises a plurality of strip-shaped sub-electrodes substantially parallel to each other, and the strip-shaped sub-electrodes are provided correspondingly to the second electrode.

6. The display apparatus of claim 5, wherein the first electrode further comprises a planer sub-electrode, the planer sub-electrode and the strip-shaped sub-electrodes are provided in a same layer, and the planar sub-electrode is provided correspondingly to an area of the thin film transistor and an area between pixel units.

7. The display apparatus of claim 5, wherein the array substrate further comprises a first via hole, and a second via hole, the common electrode line is provided in the same layer as a gate of the thin film transistor, the first electrode is connected to the common electrode line through the first via hole, and the second electrode is connected to a drain of the thin film transistor through the second via hole.

8. The display apparatus of claim 5, wherein the first electrode is made of molybdenum, aluminum, neodymium aluminum, or copper.

9. A manufacturing method of an array substrate, comprising steps of:
   forming a common electrode line, a thin film transistor, a color filter layer and a first passivation layer on a base substrate; and
   forming a first electrode on the first passivation layer, wherein the first electrode is a non-transparent metal electrode, surface of the first electrode is provided with a concave-convex structure to scatter external incident light, and the first electrode is connected to the common electrode line,
   wherein the first electrode comprises a plurality of strip-shaped sub-electrodes substantially parallel to each other and a planar sub-electrode, and the step of forming a first electrode on the first passivation layer comprises:
   forming the planar sub-electrode and the strip-shaped sub-electrodes in a same layer such that the planar sub-electrode is provided correspondingly to an area of the thin film transistor and an area between pixel units, and the strip-shaped sub-electrodes are provided correspondingly to a display area of the pixel unit.

10. The manufacturing method of claim 9, wherein the step of forming a first electrode on the first passivation layer further comprises:
   forming a metal film on the first passivation layer;
   forming a photoresist on the metal film;
   exposing, using a halftone mask or a gray-tone mask, and developing the photoresist to form a photoresist-completely-remaining area, a photoresist-partially-remaining area and a photoresist-completely-removed area, the photoresist-completely-remaining area and the photoresist-partially-remaining area corresponding to a pattern of the first electrode to be formed;
   performing a first etching on the metal film to form the first electrode;
   performing ashing treatment on the photoresist to remove the photoresist in the photoresist-partially-remaining area;
   performing a second etching on the first electrode to form the concave-convex structure; and
   removing the remaining photoresist.

11. The manufacturing method of claim 10, wherein the first etching is wet etching, and the second etching is dry etching.

12. The manufacturing method of claim 9, wherein the step of forming a thin film transistor, a color filter layer and a first passivation layer on a base substrate comprises steps of:
   forming the thin film transistor on the base substrate;
   forming the color filter layer on the thin film transistor; and forming the first passivation layer above the color filter layer,
wherein the manufacturing method comprises, before the step of forming the first passivation layer above the color filter layer, steps of:
forming a planarization layer on the color filter layer; and
forming a second electrode on the planarization layer, wherein the first passivation layer is provided on the second electrode, and the second electrode, which is a transparent electrode, is provided correspondingly to the strip-shaped sub-electrodes.

\* \* \* \* \*